US008667325B2

(12) United States Patent
Schock

(10) Patent No.: US 8,667,325 B2
(45) Date of Patent: Mar. 4, 2014

(54) METHOD, APPARATUS AND SYSTEM FOR PROVIDING MEMORY SPARING INFORMATION

(75) Inventor: John D. Schock, Lakewood, WA (US)

(73) Assignee: Intel Corporation, Santa Clara, CA (US)

( * ) Notice: Subject to any disclaimer, the term of this patent is extended or adjusted under 35 U.S.C. 154(b) by 190 days.

(21) Appl. No.: 13/075,050

(22) Filed: Mar. 29, 2011

(65) Prior Publication Data

US 2012/0254656 A1 Oct. 4, 2012

(51) Int. Cl.
*G06F 11/00* (2006.01)

(52) U.S. Cl.
USPC .......................................... 714/6.13; 714/6.2

(58) Field of Classification Search
USPC ........................................................ 714/6.13
See application file for complete search history.

(56) References Cited

U.S. PATENT DOCUMENTS

| 4,093,985 | A  | * | 6/1978  | Das ................................ 714/5.1 |
| 6,480,982 | B1 | * | 11/2002 | Chan et al. ...................... 714/764 |
| 7,900,084 | B2 | * | 3/2011  | Swanson et al. .............. 714/6.12 |
| 8,028,195 | B2 | * | 9/2011  | Anand et al. ...................... 714/22 |
| 8,041,989 | B2 | * | 10/2011 | Lastras-Montano et al. .. 714/6.2 |
| 2006/0242367 | A1 | * | 10/2006 | Ramakrishnan et al. ..... 711/152 |
| 2007/0058471 | A1 | * | 3/2007  | Rajan et al. .................... 365/222 |
| 2009/0006900 | A1 | * | 1/2009  | Lastras-Montano et al. ... 714/42 |
| 2009/0164837 | A1 | * | 6/2009  | Swanson et al. .................. 714/6 |
| 2009/0327596 | A1 | * | 12/2009 | Christenson et al. ......... 711/105 |
| 2010/0162037 | A1 | * | 6/2010  | Maule et al. ....................... 714/5 |
| 2010/0174955 | A1 | * | 7/2010  | Carnevale et al. ............. 714/718 |
| 2011/0154104 | A1 | * | 6/2011  | Swanson et al. ............. 714/6.23 |

* cited by examiner

*Primary Examiner* — Kamini Patel
(74) *Attorney, Agent, or Firm* — Blakely, Sokoloff, Taylor & Zafman LLP

(57) ABSTRACT

Techniques for implementing memory sparing with a memory controller. In an embodiment, a memory controller stores memory sparing information which is specific to a first line of memory in a memory coupled to and controller by the memory controller. In another embodiment, the memory controller includes a second memory line which is to operate as a spare for the first line of memory, where accessing the second memory line is to be a substitute for accessing the first memory line.

17 Claims, 4 Drawing Sheets

METHOD, APPARATUS AND SYSTEM FOR PROVIDING MEMORY SPARING INFORMATION

BACKGROUND

1. Technical Field

Embodiments generally relate to providing memory sparing information—i.e. information for use in implementing memory sparing. More particularly, certain embodiments provide techniques for storing memory sparing information in a memory controller, wherein the memory sparing information is specific to a line of data of a memory controlled by that memory controller.

2. Background Art

In existing memory sparing techniques, a memory controller which controls multiple ranks of random access memory (RAM) will designate one of the memory ranks to operate as an alternate for another of the memory ranks. Typically, a rank which is to be made available for operation as a spare rank is designated ahead of time when the memory system is initialized and configured. The designated rank of memory may subsequently operate as a spare rank for another rank—e.g. in response to that other rank being identified as having failed to satisfy some performance criteria.

For example, when a memory controller accesses a first memory rank to read a given chunk of data, one or more check bits in an associated check byte may also be accessed to determine the validity of the data chunk. If the chunk of data is not too corrupt, the memory controller may resort to using data in the check byte to reconstruct the data in the chunk. This reconstruction results in a corrected error correction code (ECC) error, For the purposes of memory sparing, a memory controller may keep track of the number of corrected ECC errors which are corrected over time for a given memory rank. Some spike or other trend upwards in the number of corrected FCC errors may be detected by the memory controller as being predictive of that rank of memory returning excessively corrupted, even uncorrectable, data in future.

Currently, memory sparing is a preventative measure so that when such a spike/trend indicates this unreliability of a first memory rank in future, a second memory rank is used as a spare rank to substitute for that first memory rank. Such memory sparing techniques only provide very gross, low-resolution sparing. More particularly, memory sparing is done on a rank level, where one or more memory ranks are allocated collectively to be the backup spare memory operating as a substitute for another one or more memory ranks which have failed, or are predicted to fail. However, the memory rank(s) which has been classified as failing or predicted to fail nevertheless may have comparatively few individual failed bits, and indeed may include billions of bits which are operative.

Typically, current memory sparing techniques set aside one or more unused memory ranks for the possibility of their eventual use as spare memory ranks for other memory ranks which are in use. In such techniques, memory controllers generally implement a "track switch"—e.g. to switch from using memory rank X to using (previously unused memory rank Y, from—using dual in-line memory module (DIMM) A to using previously unused DIMM B, etc. This unused memory has to be allocated memory space and power, which is a source of resource waste,

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
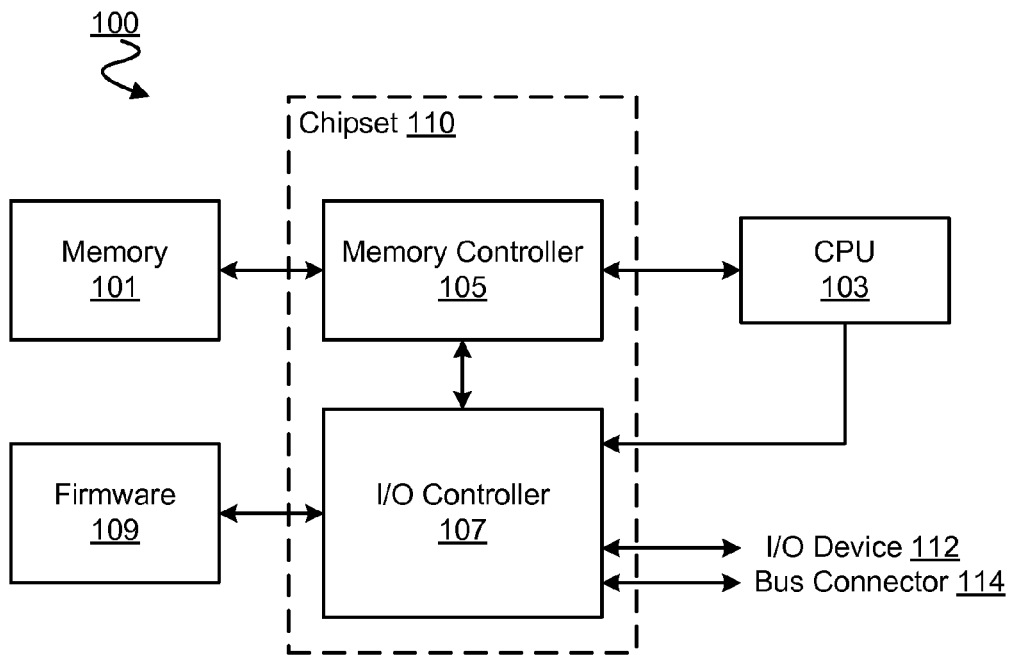
FIG. 1 is a block diagram illustrating select elements of an apparatus for storing memory sparing information according to an embodiment.

Embodiments of the invention provide techniques for storing, in a memory controller, memory sparing information which is specific to an address in a memory that is controlled by that memory controller. In an embodiment, a memory controller is coupled to one or more memory devices (e.g. including a memory module). The memory controller may be part of a chipset of a computer platform or, alternatively, integrated into a processor of such a computer platform.

The memory controller may include detect logic to receive a signal indicating a failure of a given line of memory—that is, a given addressable region of memory, where an associated address is specific to that region of memory. For example, the signal, alone or in combination with other information, may indicate to the detect logic that the given line of memory has failed or is predicted to fail. For brevity, such a line of memory is referred to herein as a "failed/failing memory line". Identification of a failed/failing memory line as such may be based on the failed/failing memory line providing—e.g. repeatedly providing, as above some threshold level—data which is corrupted by one or more errors (for example, including an uncorrectable error).

The memory controller may further include memory sparing logic to store memory sparing information in the memory controller, the storing at least partially in response to the signal received by the detect logic. The stored memory sparing information may be specific to the faied/failing memory line. By way of illustration and not limitation, the memory sparing information may be specific to a first address of the failed/failing memory line—e.g. where the memory sparing information includes information identifying an association of the first address with a second address for a memory line which is to serve as a spare for the failed/failing memory line.

In an embodiment, the memory sparing information is stored in the memory controller for later retrieval as a reference for use in determining a redirecting of a memory access request. For example, the memory controller ay, subsequent to the storing of the memory sparing information, process a request to access the failed/failing memory line, the request identifying the first address. Access redirection logic of the memory controller may detect—e.g. by referring to the memory sparing information—that the first address identified by the access request is fir a memory line which has failed or is predicted to fail. As part of, or in response to, such detecting, the access redirection logic may retrieve memory sparing information stored in the memory controller. Based on the retrieving of the memory sparing information, the access redirection logic may determine how to redirect the received request to access the failed/failing memory line. Redirecting the access request may result in an accessing of a memory line associated with the second address—i.e. as a substitute for the requested accessing of the failed/failing memory line.

FIG. 1 show select elements of an illustrative computing system 100 to provide memory sparing information in accordance with an embodiment of the present disclosure. System 100 may include a central processing unit (CPU) or processor 103, a chipset 110 which provides interfaces between processor 103 and various other elements of system 100 including, for example, memory 101 and firmware 109. The chipset 110 may include memory controller 105 and I/O controller 107. Memory controller 105 may interface the processor 103 with memory 101. I/O controller 107 may interface the processor 103 with firmware 109 (e.g., basic input/output system or BIOS), as well as with various I/O devices (e.g., serial and parallel ports such as keyboard and mouse, USB, Ethernet, IDE, etc) and/or bus connectors (e.g., PCI for graphics controller), e.g. as represented by the illustrative I/O device 112 and bus connector 114 lines. It is understood that the components and configuration of system 100 are merely illustrative, and may include any of a variety of additional or alternative components and/or configurations, according to various embodiments, for implementing the techniques described herein.

System 100 may be, for example, a computer (e.g., mainframe, desktop, laptop, game console, tablet, smart phone, etc.), or a motherboard or printed circuit card of such a computer. In a similar fashion, system 100 can be implemented as a removable processor board within a multiprocessor computer system, or a single board computer within a multi-slot card chassis having a backplane (e.g., VMEbus chassis). Other components and functionality typically found in computing systems (e.g., operating system and application software, security modules, power conditioning, internal and external bus a architectures and inter-process communication mechanisms, etc) are not shown, but will be apparent in light of factors such as the application for which system 100 is being used and matters of conventional technology.

In an embodiment, the elements shown in FIG. 1 reside on a computer platform of system 100, where the computer platform couples to a network (not shown) of system 100. By way of illustration and not limitation, the computer platform may include a network interface card (NIC) or other wired or wireless interface for the computer platform to establish a connection o an access point (not shown) of system 100 for exchanging communications with a LAN, WAN, Internet, or the like. The computer platform may, for example, include one or more antennae (not shown) coupled to the chipset 110 for exchanging such network communications.

Processor 103 may be coupled directly or indirectly to chipset 110, for example, via a conventional host bus as typically done, as well as by processor interrupt signals. Numerous conventional operative couplings between processor and chipset 110 and interrupt signal schemes can be employed here, and the present disclosure is not intended to be limited to any particular ones. Processor 103 may be any processor appropriate for a computing environment, and in one example embodiment is a microprocessor (e.g., Pentium-based processors from Intel Corporation, or any other suitable such processors). Alternatively, processor 103 may be a microcontroller having a number of I/O ports and various embedded routines, or an Application Specific Integrated Circuit (ASIC) or programmable logic. In any such cases, processor 103 may include several operating modes with varying levels of instructions, architectural features, and protection, depending on desired performance.

In operation, processor 103 may have to access memory 101. In such cases, processor 103 may issue memory access requests (e,g., read and write commands), which are processed by memory controller 105 as will be discussed in turn. Memory 101 can be implemented, for example, using any suitable memory devices. In one particular embodiment, memory 101 is implemented with one or more double data rate dynamic random-access memory (DIMM) devices and/or other such suitable memory. Numerous buffered and/or unbuffered memory configurations can be employed in accordance with embodiments of the present disclosure, whether through discrete memory devices operatively coupled together, or through a filly integrated memory.

The chipset 110 may be implemented, for example, as a northbridge-southbridge architecture, or as an accelerated hub architecture. Other suitable architectures and configurations will be apparent in light of this disclosure. The I/O controller 107 may be implemented as conventionally done, and may be used to operatively couple numerous additional storage facilities (not shown) that can be accessed or otherwise controlled by the memory controller 105.

The memory controller 105 may be configured to carry out conventional memory control operations, as well as memory control operations in accordance with various embodiments, as is further discussed herein. As previously indicated, memory controller 105 is capable of receiving memory access requests from processor 103, and then accessing memory 101 accordingly (or other storage facilities by way of I/O controller 107). Such memory control may be in accordance with embodiments of the present disclosure as the sole mode of operation, or as an optional mode that is user-selected or otherwise configurable.

In one such embodiment, the memory control mode is configurable by an agent—e.g. a BIOS (or other firmware interface process), an operating system (OS), a system management application or other software running on the OS, etc.—where processor 103 is capable of accessing a configuration of the agent stored in firmware 109 (by way of I/O controller 107). Firmware 109 can be implemented as typically done using, for example, flash or other suitable read only memory (ROM) storage (e.g., erasable programmable ROM, etc). The firmware 109 may include, for example, a menu-driven programming guide of the agent that allows a user to select line-specific memory sparing (in accordance with an embodiment of the present disclosure), or a conventional rank-level memory sparing, as the mode of operation for the host memory controller 105. Although various techniques are discussed herein with respect to a BIOS in communication with a memory controller, it is understood that such discussion may be extended to apply to any of a variety of additional or alternative suitable agents in communication with a memory controller.

In alternative embodiments, firmware 109 may also be integrated into the chipset 110. In any such cases, the memory 101, processor 103, memory controller 105, I/O controller 107, and firmware 109 may be operatively coupled (e,g., via conventional busses, or other suitable connections) as typically done. In alternative embodiments, the functionality of chipset 110 can be fully-integrated with processor 103, or at least the function of the memory controller 105 portion of chipset 110. Various alternate architectures and integrations of functionality will be apparent in light of this disclosure.

Figure 2:
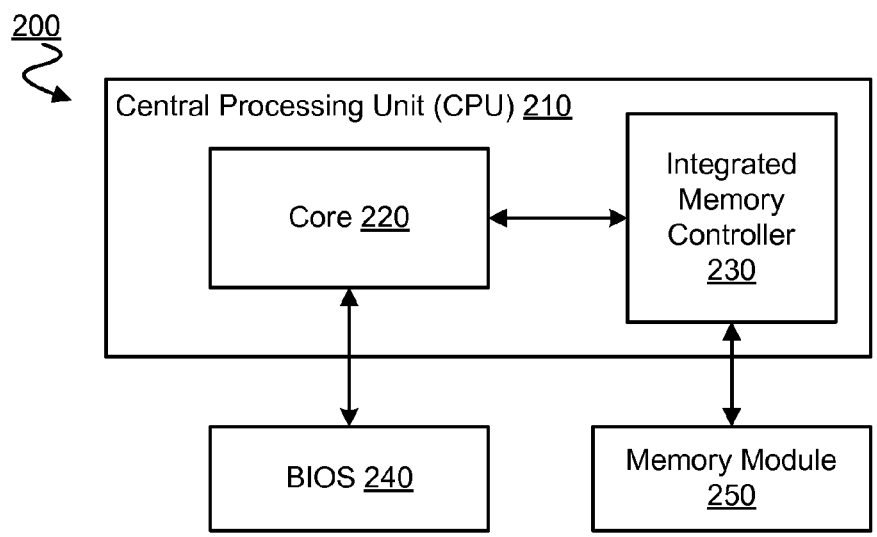
FIG. 2 is a block diagram illustrating select elements of an apparatus for storing memory sparing information according to an embodiment.

FIG. 2 show select elements of an illustrative computing system 200 to provide memory sparing information according to an embodiment. System 200 may represent an alternative configuration to that of system 100, in one embodiment, in which functionality of memory controller 105 is integrated into a processor having the functionality of CPU 103.

Figure 3:
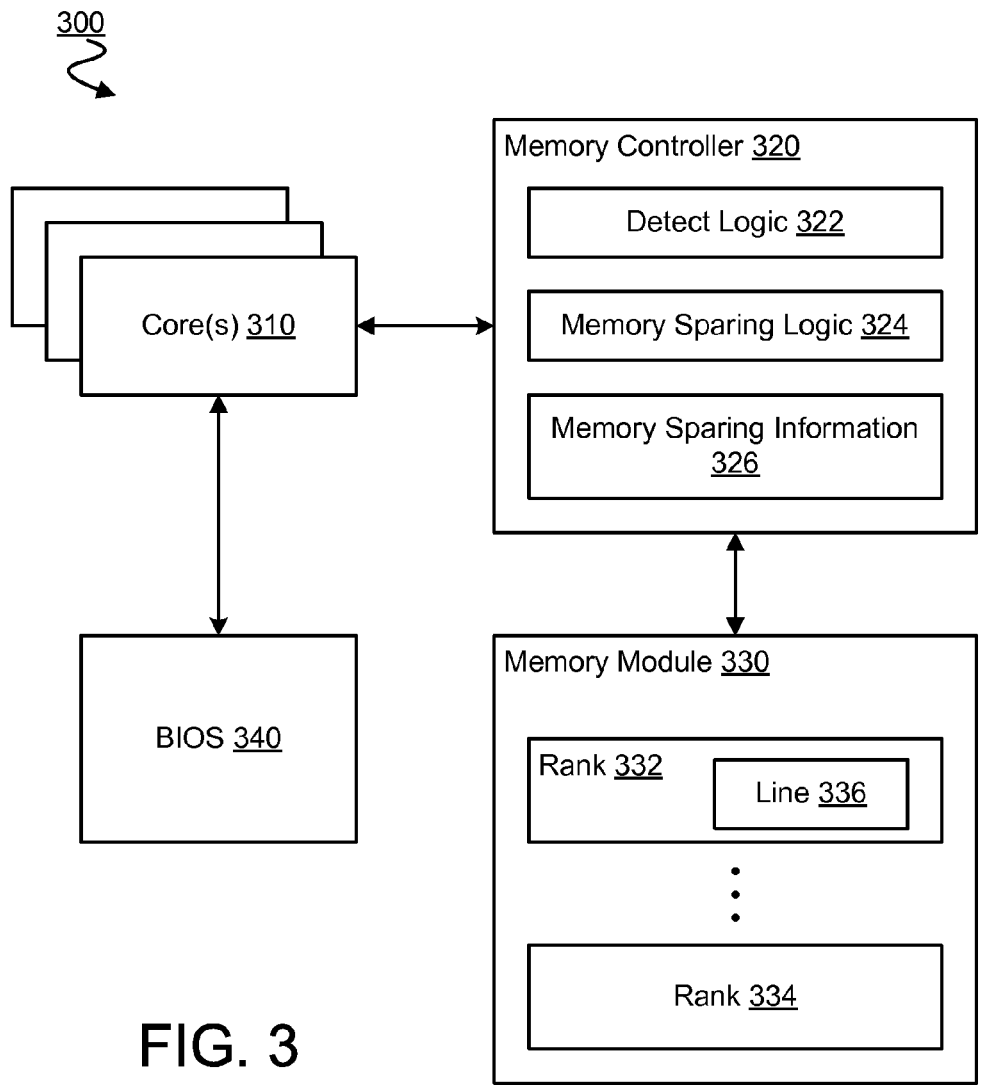
FIG. 3 is a block diagram illustrating select elements of an apparatus for storing mentor sparing information according to an embodiment.

For example, system 200 may include a central processing unit (CPU) 210, a processor core 220 of which interfaces directly or indirectly with at least one memory module 250 and a BIOS 240 (or other suitable agent). In an embodiment, CPU 210 includes an integrated memory controller (IMC) 230 for controlling memory module 250. The Intel® Core™ i7 processor is just one example of a processor which includes an IMC. Certain embodiments variously expand on the functionality of a memory controller—e.g. functionality of an IMC of a processor—to variously implement memory sparing techniques described herein, FIG. 3 shows select elements of an illustrative computing system 300 to provide memory sparing information according to a embodiment. System 300 may include some or all of the features of system 100, for example. In another example, system 300 may include some or all of the features of system 200.

In an embodiment, system 300 includes one or more processor cores, represented as core(s) 310, which are coupled to a memory controller 320—e,g, an independent memory controller or an IMC. The core(s) 310 may reside in one or more processors which provide, for example, some or all of the functionality of CPU 103, or of CPU 210. Memory controller 320 may, for example, include some or all of the functionality of memory controller 103 or of IMC 230.

Core(s) 310 may facilitate execution of BIOS 340—e.g. they may process instructions for BIOS processes in firmware 109—or some other agent suitable to exchange various communications with memory controller 320. Although described herein in terms of BIOS 340, it is understood that features of certain embodiments may be additionally or alternatively practiced by various other agents—e.g. by other types of firmware interface processes, by an operating system (OS), by a system management application or other software running on an OS, by an embedded system management controller, and the like.

In an embodiment, memory controller 320 controls access by core(s) 310 to one or more memory modules—represented by an illustrative memory module 330 including one or more ranks 332, . . . , 334. Memory module 330 may include any of a variety of random access memory (RAM) storage components. By way of illustration and not limitation, memory module 330 may include one or more of dynamic RAM (DRAM) such as synchronous DRAM (SDRAM), a single in-line memory module (SIMM), a dual memory module (DIMM), and/or any of a variety of additional or alternative RAM components. Various memory sparing techniques are discussed herein with respect to an illustrative memory line 336 of rank 332. It is understood that such discussion may be extended to apply to any of a variety of additional or alternative memory lines in one or more ranks of one or more memory modules coupled to memory controller 320.

Memory module 330 may, over time, become subject to data corruption—e.g. an error generated while data is being written to, stored in or read from memory line 336. Such errors may, for example, be a result of some flaw in integrated circuit (IC) fabrication and/or of degradation over time in one or more data storage elements of memory line 336. To limit the effect of such data corruption, memory controller 320 may provide mechanisms to detect, and perhaps correct, a resulting data error.

By way of illustration and not limitation, memory controller 320 may access from memory module 330 an error correction code (ECC), one or more parity bits, or other such information which corresponds to the data stored in memory line 336. With such information, memory controller 320 may perform a parity check or otherwise detect for an error in data read from memory line 336.

Memory controller 320 may also avail of an error correction code (ECC) scheme in which a failed bit of data read from memory line 336 is identified arithmetically from a formula using one or more check bits that are associated with the data. Alternatively or in addition, memory controller 320 may avail of a trial-and-error scheme in which an engine (not shown) tests for failed bits non-deterministically by running trials on each bit—or with reference to a lookup table—to try different changes to find a result which is consistent with a (perhaps somewhat smaller) parity or other ECC information. Various additional or alternative error detection and/or error correction mechanisms may be applied according to any of a variety of known techniques, which are not limiting on certain embodiments.

Memory controller 320 may also include or otherwise support mechanisms for determining whether corruption of data stored in memory line 336 constitutes a failure of memory line 336. By way of illustration and not limitation, memory controller 320 may include detect logic 322 including circuitry to receive a signal indicating a failure of memory line 336.

In an embodiment, the signal detected by detect logic 322 includes data read from memory line 336, where detect logic 322 determines that the data read from memory line 336 includes a data error. For example, detect logic 322 may determine that the data read from memory line 336 includes an uncorrectable error. The detecting of a data error may be based on an attempt to access from memory line 336 an instruction or other data which is to be used in an operation of a software agent executing on a processor. Alternatively or in addition, detecting of a data error may be based on an attempt to access test data which is stored to memory line 336 by test logic—e.g. logic of memory controller 320—solely for the purpose of evaluating the integrity of memory line 336.

The detection of a data error may result in detect logic 322 identifying that memory line 336 is a failed/failing memory line. Alternatively or in addition, detect logic 322 may evaluate whether a number of data corruption events, a frequency of data corruption events, or some other performance parameter exceeds a corresponding threshold value. Such evaluating of one or more data corruption events, the frequency thereof, etc. may be according to various known techniques, and are not limiting on certain embodiments.

Alternatively or in addition, memory controller 320 may include logic to communicate information to a process of BOIS 340, the information describing a corruption of data read from memory line 336. Based on information communicated from memory controller 320, BIOS 340 may evaluate whether a number of data corruption events, a frequency of data corruption events, or some other performance parameter exceeds a corresponding threshold value. In response to such an evaluation, BIOS 340 may determine that memory line 336 has failed, or is predicted to fail. BIOS 340 may then communicate to detect logic 322 a signal indicated that memory line 336 is a failed/failing memory line. Any of a variety of additional or alternative techniques for identifying a failed/failing memory line may be implemented in system 300.

In response to identifying that memory line 336 is a failed/failing memory line, memory sparing logic 324 of memory controller 320 may store in memory controller 320 memory sparing information 326 which is specific to memory line 336. More particularly, memory controller 320 may include one or more RAM locations to store memory sparing information 326 which identities an association of the first address of memory line 336 with an address of a spare, second memory line which is to serve as a substitute for memory line 336.

In an embodiment, the second memory line may reside in memory controller 320—e.g. as part of memory sparing information 326. Alternatively, the second memory line may reside in a memory module controlled by memory controller 320—e.g. in memory module 330 or some other memory module (not shown).

After storing memory sparing information 326 specific to the memory line 336—e.g. specific to the first address for memory line 336—memory controller 320 may redirect a request from core(s) 310 to access memory line 336. For example, memory controller 320 may process a memory access request message which identifies the first address. Processing of such request may include operations by access redirection logic (not shown) of memory controller 320. The access redirection logic may, in an embodiment, reside in memory sparing logic 324.

The access redirection logic may access memory sparing information 326 in response to the memory access request identifying the first address. Based on the memory sparing information, the access redirection logic may redirect the received memory access request. For example, the access redirection logic may determine, based on the accessing of the memory sparing information 326, that the first address is associated with a failed/failing memory line—i.e. memory line 336. The access redirection logic may further determine that the second address is associated with the first address by the memory sparing information. Based on such determinations, the access redirection logic may redirect memory controller 320 from accessing memory line 336 to service the memory access request to instead accessing the spare memory line associated with the second address. In an embodiment, memory controller 320—e.g. memory sparing information 326—includes the spare memory line associated with the second address. More particularly, a second memory line in memory controller 320 may store data as a substitute for memory line 336 even prior to memory controller 320 processing a request for data from memory line 336.

Figure 4:
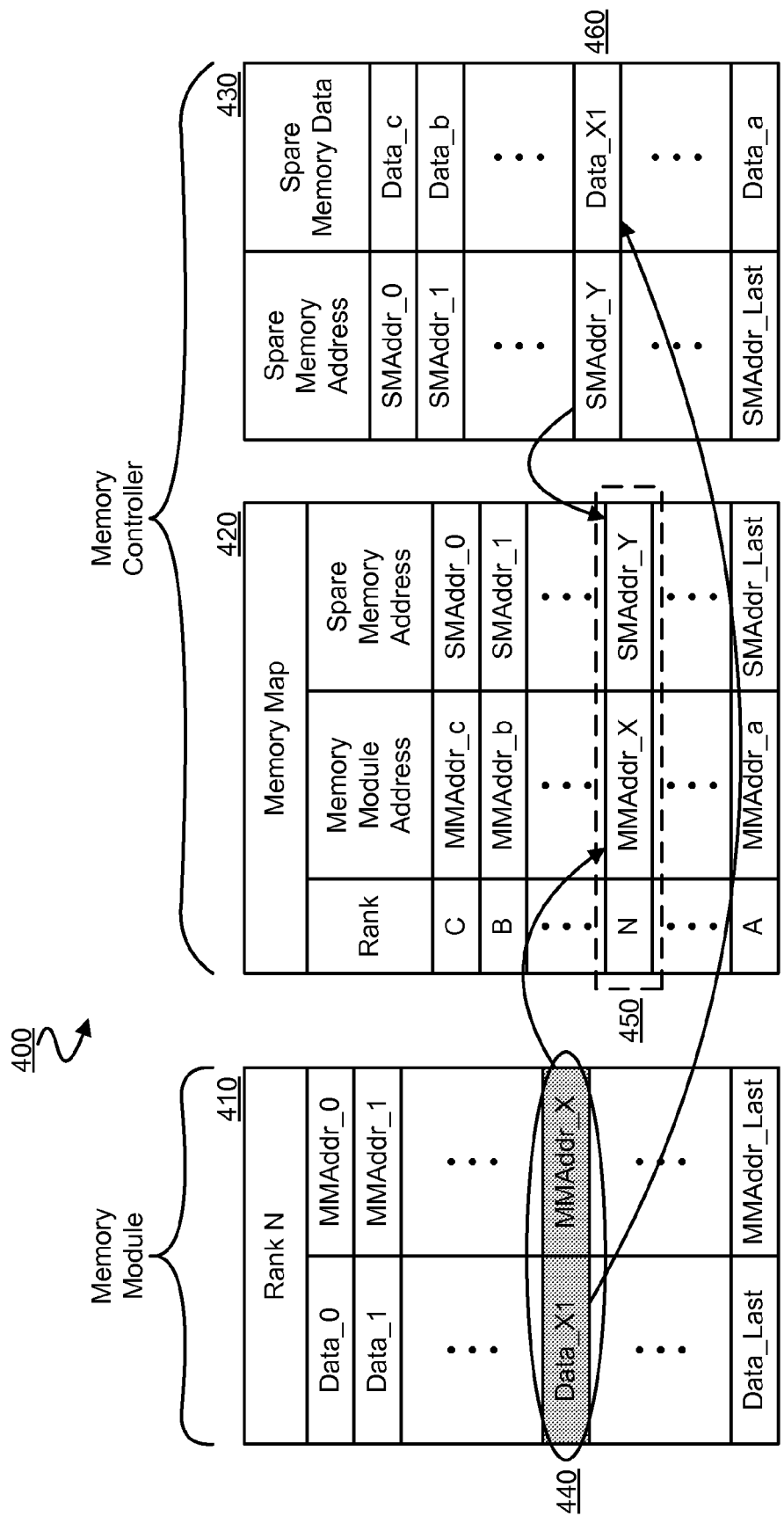
FIG. 4 is a data diagram illustrating select elements of memory sparing information which is stored according to an embodiment.

FIG. 4 shows select elements of an illustrative set of data structures 400 used to provide memory sparing information according to an embodiment. The data structures 400 may be located in a computer system such as system 300, for example.

The data structures 400 include an illustrative rank N 410 which, for example, may reside in a memory device such as memory module 330. Rank N 410 may be the only rank of a memory system, or alternatively one of many ranks. Rank N 410 ay include one or more memory lines, wherein each memory line is addressable by a respective one of addresses MMAddr_0, . . . , MMAddr_Last, and at a given time, each memory line stores a respective one of data Data_0, . . . , Data_Last. It is understood that the number of memory lines of rank N 410, and the data in the memory lines, is merely illustrative, and that the number and contents of the memory lines of rank N 410 are not limiting on certain embodiments.

Data structures 400 may further include a memory map 420 having one or more entries, each entry to store data which is made available for use as a reference in determining a redirection of a memory access request. Memory map 420 may identify an association of an address of a memory line of the memory module with an address f a respective spare memory line. Memory map 420 may reside in a memory controller such as memory controller 320. Each entry of the illustrative memory map 420 identifies both a rank and an address of a memory line in a memory module. In another embodiment, the rank information may be combined with the address information. In still another embodiment—e.g. where a computer system is concerned with only one memory rank—memory map 420 may omit any identification of a memory rank.

Each entry of map 420 further includes an identifier of an address of a spare memory line which is to serve as a substitute for the other memory line indicated in that entry. It is understood that memory sparing information may use any of a variety of additional or alternative data to associate a given memory line with a spare memory line which is to serve as its substitute. It is also understood that the number of entries of memory map 420, and the information in the entries, is merely illustrative, and that the number and contents of the entries of memory map 420 are not limiting on certain embodiments.

Data structures 400 may further include spare memory 430 including one or more lines of RAM configurable to variously serve as substitutes for respective memory lines of the memory module. Spare memory 430 may reside within the memory controller, although certain embodiments are not limited in this regard.

Spare memory 430 may include one or more memory lines, wherein each memory line is addressable by a respective one of addresses SMMAddr_0, . . . , SMAddr_Last. At a given time, a given memory line of spare memory 430 may store data on behalf of a memory line in a memory coupled to, and controlled by, the memory controller. It is understood that the number of memory lines of spare memory 430, and the information in the memory lines, is merely illustrative, and that the number and contents of the memory lines of spare memory 430 are not limiting on certain embodiments.

In an illustrative example, a memory line 440 may be identified as a failed/failing memory line. Such identifying may occur, for example, according to the techniques discussed with respect to memory line 336. In response to the identifying of memory line 440 as a failed/failing memory line, a memory line 460 of spare memory 430 may be allocated to be the spare for memory line 440, where accessing of memory line 460 is o serve as a substitute for accessing memory line 440. To facilitate such allocating, the current data Data_X1 of memory line 440 may be stored to memory line 460. Additionally or alternatively, an entry 450 of memory map 420 may store an identifier of the address MMAddr_X for memory line 440 and an identifier of the address SMAddr_Y of memory line 460 in spare memory 430 which is to serve as a spare memory line.

In an embodiment, the indication that memory line 440 is a failed/failing line may be specific to memory line 440. More particularly, the indication that memory line 440 is a failed/failing line may be agnostic to, or otherwise independent of, any indication of whether some other memory line is a failed/failing memory line. Alternatively or in addition, a decision to store memory sparing information specific to memory line 440 (in response to the indication that memory line 440 is a failed/failing line) may be agnostic to, or otherwise independent of, any decision to store memory sparing information associated with some other memory line. By way of illustration and not limitation, the decision to store memory sparing information in response to the indication that memory line 440 is a failed/failing line may result in the storing of memory sparing information which is only to facilitate memory sparing for memory line 440. In an embodiment, the storing of memory sparing information which is to facilitate memory sparing of any other memory line may have to be decided separately, and may require an additional indication of some other failed/failing memory line. Alternatively or in addition, a location to store memory sparing information to may be determined dynamically in response to the indication that memory line 440 is a failed/failing line. For example, the location of a memory line which is to serve as a spare for memory line 440 may be determined without the spare memory line having been pre-allocated for such service prior to the detecting of the indication that memory line 440 is a failed/failing memory line.

After being stored in memory map 420, the memory sparing information in entry 450 may be available for use as a reference in redirecting a memory access request which specifies memory line 440—e.g. a request which includes an identifier of address MMAddr_X. Such redirecting may include accessing entry 450 and determining thereby that data in memory line 460 is to be accessed in lieu of accessing data in memory line 440. It is understood that the data in memory line 460 may change over time from that data in memory line 440—e.g. as attempted updated to memory line 440 instead are redirected to update memory line 460.

Figure 5:
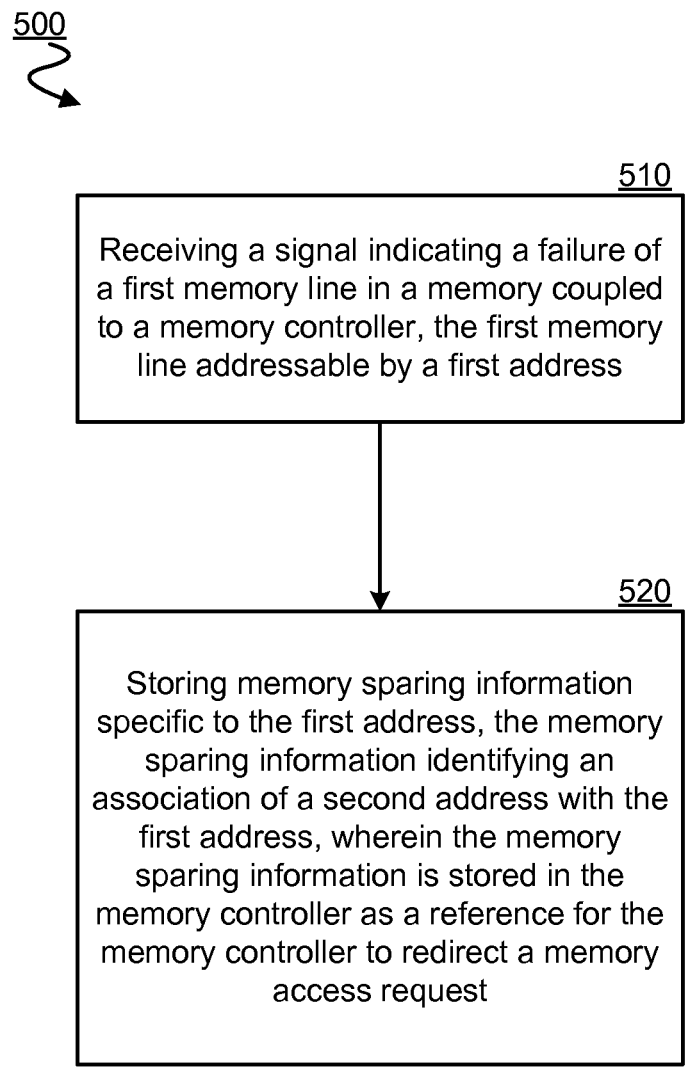
FIG. 5 is a flow diagram illustrating select elements of a method for storing memory sparing information according to an embodiment.

FIG. 5 shows select elements of an illustrative method 500 for providing memory sparing information according to an embodiment. Method 500 may be performed by a memory controller such as memory controller 320, for example.

In an embodiment, method 500 includes, at 510, receiving a signal indicating a failure of a first memory line in a memory coupled to the memory controller. The signal may include, for example, data read from the first memory line, where the data is corrupted. Alternatively or in addition, the signal may include a message identifying that the first memory line is a failed/failing memory line. For example, the memory controller may detect a data error and generate a report of such an error to an agent such as a BIOS (or other firmware interface process), an operating system (OS), or a system management application or other software running on the OS. The agent may then process such a report and decide—e.g. according to a policy—whether and how memory sparing is to be implemented. The agent may then configure the memory controller for such memory sparing.

In response to the received signal, method 500 may, at 520, store memory sparing information which is specific to a first address for the first memory line. In an embodiment, the memory sparing information is stored in the memory controller for use by the memory controller as a reference to redirect a memory access request. The memory sparing information may identify an association of a second address with the first address. For example, the second address may be specific to a spare memory line which is to serve as a substitute for the first memory line. In an embodiment, the spare memory line resides within the memory controller itself, and is available as a reference to be used in determining how the memory controller is to redirect a subsequent memory access request.

Techniques and architectures for memory sparing are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form m order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their w to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a memory controller to couple to a memory including a
   plurality of ranks comprising a first rank including multiple memory lines each addressable by a different respective address, the multiple memory lines comprising a memory line A addressable by a first address, the memory controller including:

detection logic to receive a signal indicating a failure of the memory line A, wherein, of the multiple memory lines, the signal indicates failure of only the memory line A; and memory sparing logic coupled to the detection logic, the memory sparing logic to store, in response to the received signal, first memory sparing information identifying an association of a second address with the first address, wherein the first memory sparing information is stored in the memory controller as a reference for the memory controller to redirect a memory access request, wherein, of the multiple memory lines, only memory sparing information for memory sparing of the memory line A is stored in response to the received signal;

the memory controller further to receive a request to access the memory line A, the request identifying the first address, the memory controller further comprising:

access redirection logic to access the first memory sparing information in response to the received request, and based on the first memory sparing information, the access redirection logic further to redirect the received request for an access of a memory line addressable by the second address.

2. The apparatus of claim 1, the memory controller further comprising a second memory line addressable by the second address.

3. The apparatus of claim 1, wherein the memory includes a dual in-line memory module (DIMM).

4. The apparatus of claim 1, wherein the apparatus includes a processing unit, and wherein the memory controller is an integrated memory controller of the processing unit.

5. The apparatus of claim 1, wherein the signal indicates a failure of the memory line A to provide data which is free of error.

6. The apparatus of claim 5, wherein the signal indicates a failure of the memory line A to provide data which is free of uncorrectable error.

7. The apparatus of claim 6, wherein the failure is a predicted failure of the memory line.

8. The apparatus of claim 1, the apparatus further comprising a processor to execute an agent communicatively coupled to provide a memory sparing policy decision to the memory controller, wherein the first memory sparing information is stored in the memory controller in response to the agent providing the memory sparing policy decision.

9. A method performed at a memory controller, the method comprising:

receiving a signal indicating a failure of a memory line A of a memory coupled to the memory controller, the memory including a plurality of ranks comprising a first rank including multiple memory lines each addressable by a different respective address, the multiple memory lines comprising the memory line A, wherein the memory line A is addressable by a first address, wherein, of the multiple memory lines, the signal indicates failure of only the memory line A;

in response to the received signal, storing first memory sparing information identifying an association of a second address with the first address, wherein the first memory sparing information is stored in the memory controller as a reference for the memory controller to redirect a memory access request, wherein, of the multiple memory lines, only memory sparing information for memory sparing of the memory line A is stored in response to the received signal;

receiving a request to access the memory line A, the request identifying the first address;

in response to the received request, accessing the first memory sparing information; and based on the accessing the first memory sparing information, redirecting the received request for an access of a memory line addressable by the second address.

10. The method of claim 9, wherein the memory controller comprises a second memory line addressable by the second address.

11. The method of claim 9, wherein the memory includes a dual in-line memory module (DIMM).

12. The method of claim 9, wherein the memory controller is an integrated memory controller of a processing unit.

13. The method of claim 9, wherein the signal indicates a failure of the memory line A to provide data which is free of error.

14. The method of claim 9, wherein the first memory sparing information is stored in the memory controller in response a memory sparing policy decision provided to the memory controller by an external agent.

15. A system comprising:

a dynamic random access memory (DRAM) including a plurality of ranks comprising a first rank including multiple memory lines each addressable by a different respective address, the multiple memory lines comprising a memory line A addressable by a first address; and a memory controller to couple to the DRAM, the memory controller including:

detection logic to receive a signal indicating a failure of the memory line A, wherein, of the multiple memory lines, the signal indicates failure of only the memory line A;

a memory map; and memory sparing logic coupled to the detection logic, the memory sparing logic to store, in response to the received signal, first memory sparing information identifying an association of a second address with the first address, wherein the first memory sparing information is stored in the memory map as a reference for the memory controller to redirect a memory access request, wherein, of the multiple memory lines, only memory sparing information for memory sparing of the memory line A is stored in response to the received signal;

the memory controller further to receive a request to access the memory line A, the request identifying the first address, the memory controller further comprising:

access redirection logic to access the first memory sparing information in response to the received request, and based on the first memory sparing information, the access redirection logic further to redirect the received request for an access of a memory line addressable by the second address.

16. The system of claim 15, the memory controller further comprising a second memory line addressable by the second address.

17. The system of claim 15, wherein the DRAM includes a dual in-line memory module (DIMM).

\* \* \* \* \*

UNITED STATES PATENT AND TRADEMARK OFFICE
CERTIFICATE OF CORRECTION

| | | |
|---|---|---|
| PATENT NO. | : 8,667,325 B2 | Page 1 of 1 |
| APPLICATION NO. | : 13/075050 | |
| DATED | : March 4, 2014 | |
| INVENTOR(S) | : Schock | |

It is certified that error appears in the above-identified patent and that said Letters Patent is hereby corrected as shown below:

In the Specification

Column 1, line 35 delete, ""FCC"" and insert --ECC--.

Column 2, line 44 delete, ""faied"" and insert --failed--.

Column 2, line 54 delete, ""the memory controller ay"" and insert --the memory controller may--.

Column 3, line 61 delete, ""external bus a architectures"" and insert --external bus architectures--.

Column 3, line 44 delete, ""connection o an access point"" and insert --connection to an access point--.

Column 4, line 11 delete, ""filly"" and insert --fully--.

Column 6, line 67 delete, ""identities"" and insert --identifies--.

Column 7, line 50 delete, ""410 ay include"" and insert --410 may include--.

Column 7, line 63 delete, ""address f a respective"" and insert --address of a respective--.

Column 9, line 60 delete, ""diagram form m order"" and insert --diagram form in order--.

Column 10, line 6 delete, ""substance of their w to others"" and insert --substance of their work to others--.

Signed and Sealed this
Twenty-fifth Day of November, 2014

Michelle K. Lee
*Deputy Director of the United States Patent and Trademark Office*